US012024777B2

(12) United States Patent
Lee et al.

(10) Patent No.: US 12,024,777 B2
(45) Date of Patent: Jul. 2, 2024

(54) METHOD OF PROCESSING SUBSTRATE (71) Applicant: WONIK IPS CO., LTD., Pyeongtaek-si (KR)

(72) Inventors: Dae Seong Lee, Dongducheon-si (KR); Hyeon Beom Gwon, Seoul (KR); Kyung Park, Seoul (KR)

(73) Assignee: WONIK IPS CO., LTD, Pyeongtaek-si (KR)

( * ) Notice: Subject to any disclaimer, the term of this patent is extended or adjusted under 35 U.S.C. 154(b) by 39 days.

(21) Appl. No.: 17/408,114

(22) Filed: Aug. 20, 2021

(65) Prior Publication Data
US 2022/0127725 A1    Apr. 28, 2022

(30) Foreign Application Priority Data
Oct. 28, 2020 (KR) .......................... 10-2020-0141611

(51) Int. Cl.
C23C 16/455    (2006.01)
C23C 16/34    (2006.01)
(Continued)

(52) U.S. Cl.
CPC .............. C23C 16/56 (2013.01); C23C 16/34 (2013.01); C23C 16/45534 (2013.01);
(Continued)

(58) Field of Classification Search
None
See application file for complete search history.

(56) References Cited

U.S. PATENT DOCUMENTS

2007/0187386 A1    8/2007 Kim et al.
2017/0062249 A1*   3/2017 Aoyama ........... H01L 21/28185
(Continued)

FOREIGN PATENT DOCUMENTS

CN    1323057 A    11/2001
CN    106486397 A    3/2017
(Continued)

OTHER PUBLICATIONS

"Normal pressure." Merriam-Webster.com Dictionary, Merriam-Webster, https://www.merriam-webster.com/dictionary/normal%20pressure. Accessed Oct. 29, 2020 by internet archive wayback machine: https://web.archive.org/web/20201029170154/https://www.merriam-webster.com/dictionary/normal%20pressure (Year: 2020).*

Primary Examiner — Jose I Hernandez-Kenney
(74) Attorney, Agent, or Firm — William Park & Associates Ltd.

(57) ABSTRACT

The present disclosure relates to a substrate processing method, and more particularly, to a substrate processing method for improving the physical properties of a thin film formed on a substrate. An embodiment of a substrate processing method according to the present disclosure comprises the steps of: carrying a substrate into a first chamber; a first pressurizing step increasing the pressure in the first chamber so that the pressure in the first chamber reaches a first high-pressure that is higher than the normal pressure; a first depressurizing step decreasing the pressure in the first chamber so that the pressure in the first chamber reaches a second high-pressure that is lower than the first high-pressure and equal to or higher than the normal pressure; a first pressurizing/depressurizing repeating step performing the first pressurizing step and the first depressurizing step repeatedly at a predetermined number of times; and a second depressurizing step decreasing the pressure in the first (Continued)

chamber so that the pressure in the first chamber reaches a first low-pressure that is lower than the normal pressure.

16 Claims, 8 Drawing Sheets

(51) Int. Cl.
    *C23C 16/56*     (2006.01)
    *H01L 21/02*     (2006.01)
    *H01L 21/28*     (2006.01)
    *H01L 21/768*     (2006.01)
    *C23C 14/58*     (2006.01)

(52) U.S. Cl.
    CPC .... *C23C 16/45557* (2013.01); *H01L 21/0228* (2013.01); *H01L 21/02337* (2013.01); *H01L 21/28185* (2013.01); *H01L 21/28202* (2013.01); *H01L 21/76856* (2013.01); *C23C 14/5846* (2013.01)

(56) References Cited

U.S. PATENT DOCUMENTS

| | | |
|---|---|---|
| 2017/0233866 A1 | 8/2017 | Oikawa |
| 2019/0148178 A1 | 5/2019 | Liang et al. |
| 2021/0118682 A1* | 4/2021 | Jang .................. H01L 21/28088 |
| 2022/0127725 A1 | 4/2022 | Lee et al. |

FOREIGN PATENT DOCUMENTS

| | | | |
|---|---|---|---|
| JP | 2009539231 A | | 11/2009 |
| JP | 2015026692 A | * | 2/2015 |
| JP | 2017045982 A | | 3/2017 |
| JP | 2017045983 A | | 3/2017 |
| JP | 2020521876 A | | 7/2020 |
| KR | 1020200006422 A | | 1/2020 |

* cited by examiner

METHOD OF PROCESSING SUBSTRATE

This application claims priority to Korean Patent Applications No. 10-2020-0141611, filed on Oct. 28, 2020, all the benefits accruing therefrom under 35 U.S.C. § 119, the disclosures of which are incorporated herein in its entirety by reference.

TECHNICAL FIELD

The present disclosure relates to a substrate processing method, and more particularly, to a substrate processing method for improving the physical properties of a thin film formed on a substrate.

BACKGROUND

In general, semiconductor devices are manufactured through the process of depositing and etching various thin films on a substrate. Various methods such as physical vapor deposition (PVD), chemical vapor deposition (CVD), and atomic layer deposition (ALD) are used to deposit the thin film. Since the process temperatures, the process pressures, and the gases are used for the respective method, there are many cases where the physical properties of the deposited thin film do not meet the desired properties.

To alleviate the problem, a method for improving the physical properties of the thin film by using post-process after depositing the thin film has been used. Various methods such as heat treatment and plasma treatment etc. are used for post-process.

Since a 3-dimensional (3D) semiconductor device such as a 3D NAND flash device or a semiconductor device having a high aspect ratio such as a DRAM capacitor requires excellent step coverage, usage of low-temperature process or precursors with high content of impurities is increasing. However, in these cases, the content of impurities in the deposited thin film increases, or it becomes more difficult to form a thin film having the desired physical properties (specific resistance, composition ratio, density, etc.), therefore, a new substrate processing method that can improve the physical properties of a thin film using post-process after depositing the thin film is needed.

It is an object of the present disclosure to solve the conventional problem and to provide a substrate processing method that can improve the physical properties of a thin film formed on a substrate.

SUMMARY

To solve the conventional problems, an embodiment of a substrate processing method according to the present disclosure comprises the steps of: carrying a substrate into a first chamber; a first pressurizing step for increasing the pressure in the first chamber so that the pressure in the first chamber reaches a first high-pressure that is higher than the normal pressure; a first depressurizing step for decreasing the pressure in the first chamber so that the pressure in the first chamber reaches a second high-pressure that is lower than the first high-pressure and equal to or higher than the normal pressure; a first pressurizing/depressurizing repeating step for performing the first pressurizing step and the first depressurizing step repeatedly at a predetermined number of times; and a second depressurizing step for decreasing the pressure in the first chamber so that the pressure in the first chamber reaches a first low-pressure that is lower than the normal pressure. According to another embodiment of the present invention, if the second high-pressure is greater than the normal pressure, the second depressurizing step comprises: a 2-1 depressurizing step lowering the pressure in the first chamber so that the pressure in the first chamber becomes the normal pressure; and a 2-2 depressurizing step lowering the pressure in the first chamber so that the pressure in the first chamber becomes said first low-pressure, or if the second high-pressure is the normal pressure, the second depressurizing step comprises: said 2-2 depressurizing step lowering the pressure in the first chamber so that the pressure in the first chamber becomes said first low-pressure. According to another embodiment of the present invention, before the 2-2 depressurizing step, the second decompression step further comprises: a first normal pressure maintaining step maintaining the normal pressure for a predetermined time. According to another embodiment of the present invention, said first normal pressure maintaining step further comprises providing purge gas.

According to another embodiment of the present invention, after the second depressurizing step, the method further comprises: a first low-pressure maintaining step maintaining the first low-pressure for a predetermined time. According to another embodiment of the present invention, between the first pressurizing step and the first depressurizing step, the method further comprises: a first high-pressure maintaining step maintaining said first high-pressure for a predetermined time, and the pressurizing/depressurizing repeating step performing repeatedly the first pressurizing step, the first high-pressure maintaining step, and the first depressurizing step in this order. According to another embodiment of the present invention, the first pressurizing step is performed in a first gas atmosphere, and, after the second depressurizing step, the method further comprises: a second pressurizing step increasing the pressure in the first chamber to reach a third high-pressure that is higher than the normal pressure; a third depressurizing step decreasing the pressure in the first chamber to reach a fourth high-pressure that is lower than the third high-pressure and higher than the normal pressure; a second pressurizing/depressurizing repeating step performing the second pressurizing step and the third depressurizing step repeatedly at a predetermined number of times; and a fourth depressurizing step decreasing the pressure in the first chamber to reach a second low-pressure that is lower than the normal pressure. According to another embodiment of the present invention, the first pressurizing step is performed in a first gas atmosphere, after the second depressurizing step, the method further comprises: carrying out the substrate from the first chamber; carrying in the substrate into a second chamber; a second pressurizing step increasing the pressure in the second chamber to reach a third high-pressure that is higher than the normal pressure in a second gas atmosphere that is different from the first gas atmosphere; a third depressurizing step decreasing the pressure in the second chamber to reach a fourth high-pressure that is lower than the third high-pressure and higher than the normal pressure; a second pressurizing/depressurizing repeating step performing the second pressurizing step and the third depressurizing step repeatedly at a predetermined number of times; and a fourth depressurizing step decreasing the pressure in the second chamber to reach a second low-pressure that is lower than the normal pressure. According to another embodiment of the present invention, after the fourth depressurizing step, the method further comprises: a second low-pressure maintaining step maintaining the second low-pressure for a predetermined time. According to another embodiment of the present invention, if the fourth high-pressure is greater than the normal pressure, the fourth depressurizing step comprises: a 4-1 depressurizing step lowering the pressure in the first chamber so that the pressure in the first chamber becomes the normal pressure; and a 4-2 depressurizing step lowering the pressure in the first chamber so that the pressure in the first chamber becomes said second low-pressure, or if the fourth high-pressure is the normal pressure, the fourth depressurizing step comprises: said 4-2 depressurizing step lowering the pressure in the first chamber so that the pressure in the first chamber becomes said second low-pressure. According to another embodiment of the present invention, if the fourth high-pressure is greater than the normal pressure, the fourth depressurizing step comprises: a 4-1 depressurizing step lowering the pressure in the second chamber so that the pressure in the second chamber becomes the normal pressure; and a 4-2 depressurizing step lowering the pressure in the second chamber so that the pressure in the second chamber becomes said second low-pressure, or if the fourth high-pressure is the normal pressure, the fourth depressurizing step comprises: said 4-2 depressurizing step lowering the pressure in the second chamber so that the pressure in the second chamber becomes said second low-pressure. According to another embodiment of the present invention, before the 4-2 depressurizing step, the fourth decompression step further comprises: a second normal pressure maintaining step maintaining the normal pressure for a predetermined time. According to another embodiment of the present invention, said second normal pressure maintaining step further comprises providing purge gas. According to another embodiment of the present invention, between the second pressurizing step and the third depressurizing step, the method further comprises: a second high-pressure maintaining step for maintaining said third high-pressure for a predetermined time, and the second pressurizing/depressurizing repeating step performs the second pressurizing step, the second high-pressure maintaining step, and the third depressurizing step repeatedly in this order at a predetermined number of times. According to another embodiment of the present invention, the first gas contains at least one of hydrogen (H), oxygen (O), nitrogen (N), chlorine (Cl), and fluorine (F). According to another embodiment of the present invention, the second gas contains at least one of hydrogen (H), oxygen (O), nitrogen (N), chlorine (Cl), and fluorine (F). According to another embodiment of the present invention, a thin film is formed on the substrate. According to another embodiment of the present invention, the thin film constitutes at least a part of the gate insulating film of the transistor. According to another embodiment of the present invention, the thin film contains at least one of the metal element, a Group IV element, a III-V compound, a II-VI compound, nitrogen (N), oxygen (O), and boron (B).

According to the present disclosure, it is possible to remove impurities in the thin film after forming the same and improve the characteristics of the thin film by pressurizing it in a chamber and then depressurizing the same rapidly. Particularly, according to the present disclosure, the processing time can be shortened greatly, and electrical properties can be improved by removing impurities in the thin film with the repeated pressurizing and depressurizing process at a pressure higher than or equal to the normal pressure. Furthermore, as the processing time is shortened, the heat treatment time can be also reduced, thereby reducing the heat budget.

The substrate processing method according to the present disclosure can be applied to a wide variety of substrate processing methods since it is possible to perform a uniform process for a 3-D semiconductor device or a device having a high aspect ratio as an independent process.

The substrate processing method according to the present disclosure may be performed before forming the thin film to improve the substrate surface characteristics and may be performed during forming the thin film to improve thin film characteristics.

Furthermore, according to the substrate processing method of the present disclosure, the characteristics of the thin film can be improved by using a heat treatment process at a relatively lower temperature and energy than a high temperature and energy used in the conventional heat treatment process by removing impurities effectively. Especially, as the reduced pressure is maintained for a certain period, the effect of removing impurities increases. In the case of the nitride film, by adding a step of performing a pressurizing/depressurizing process in a gas atmosphere containing nitrogen (N), it is possible to increase the nitrogen (N) content in the thin film, thus improving oxidation resistance.

BRIEF DESCRIPTION OF THE DRAWINGS

FIGS. 2A and 2B are drawings schematically showing the pressure changes inside a first chamber of an embodiment of a substrate processing method according to the present disclosure.

DETAILED DESCRIPTION

Hereinafter, embodiments of the present disclosure will be described in detail with reference to the accompanying drawings. The embodiments of the present disclosure are to provide the persons having ordinary skill in the art with a more complete description of the present disclosure, and the following examples may be modified in various other forms, however, the scope of the present disclosure is not limited to the embodiments. Rather, the embodiments are provided to render the present disclosure more faithful and complete and to fully introduce the spirit of the present disclosure to the persons having ordinary skill in the art.

In the drawings, for example, depending on manufacturing techniques and/or tolerances, variations of the illustrated shape can be expected. Accordingly, the embodiments of the present disclosure should not be construed as being limited to the specific shape of the region disclosed in the present specification but should include, for example, changes in a shape caused when manufacturing the same. The same reference numerals are assigned to similar parts throughout the specification. Furthermore, various elements and areas in the drawings are schematically drawn. Accordingly, the present disclosure is not limited by the relative size or spacing drawn in the accompanying drawings.

Figure 1:
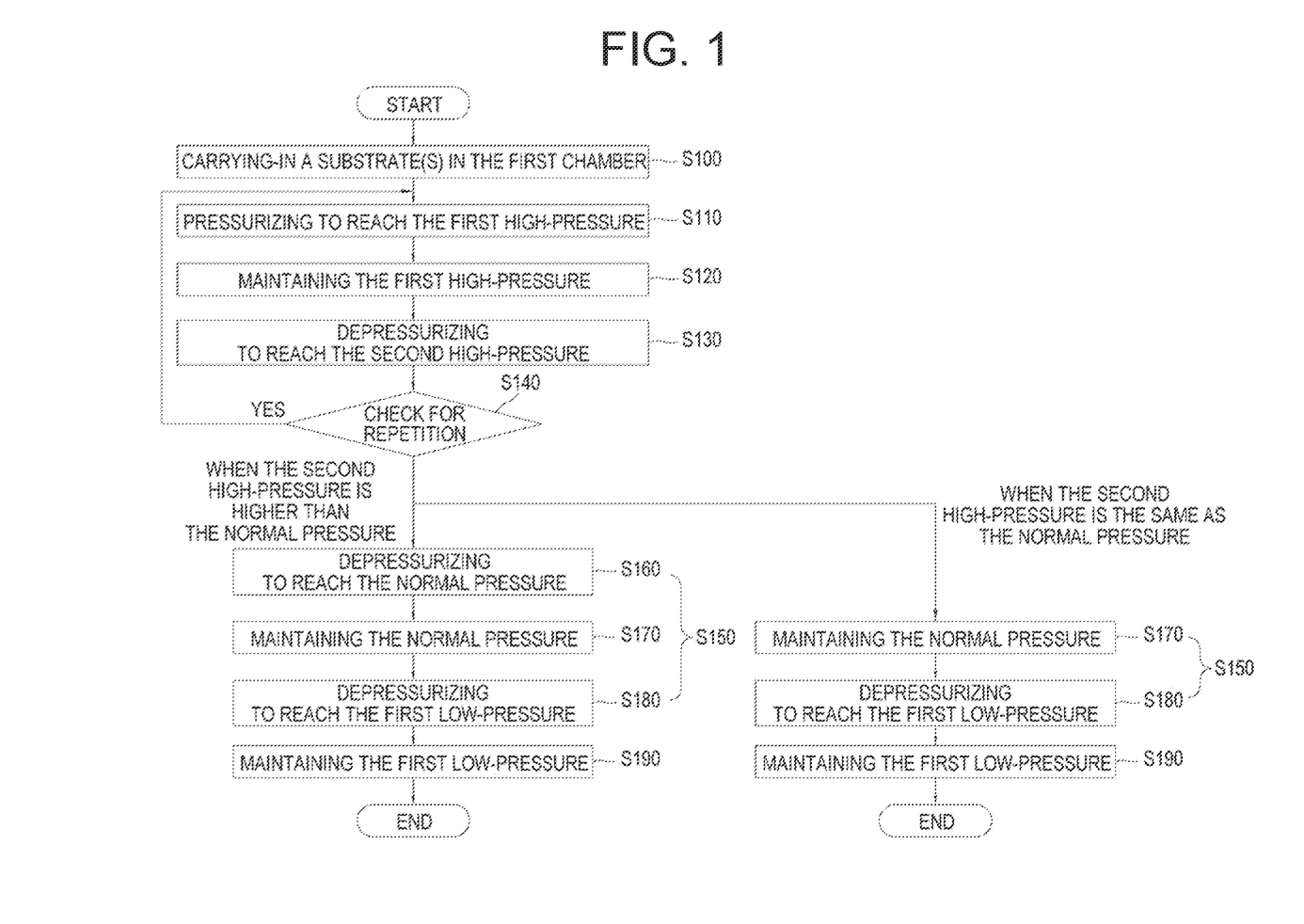
FIG. 1 is a flowchart illustrating a process of performing an embodiment of a substrate processing method according to the present disclosure.
Figure 2A:
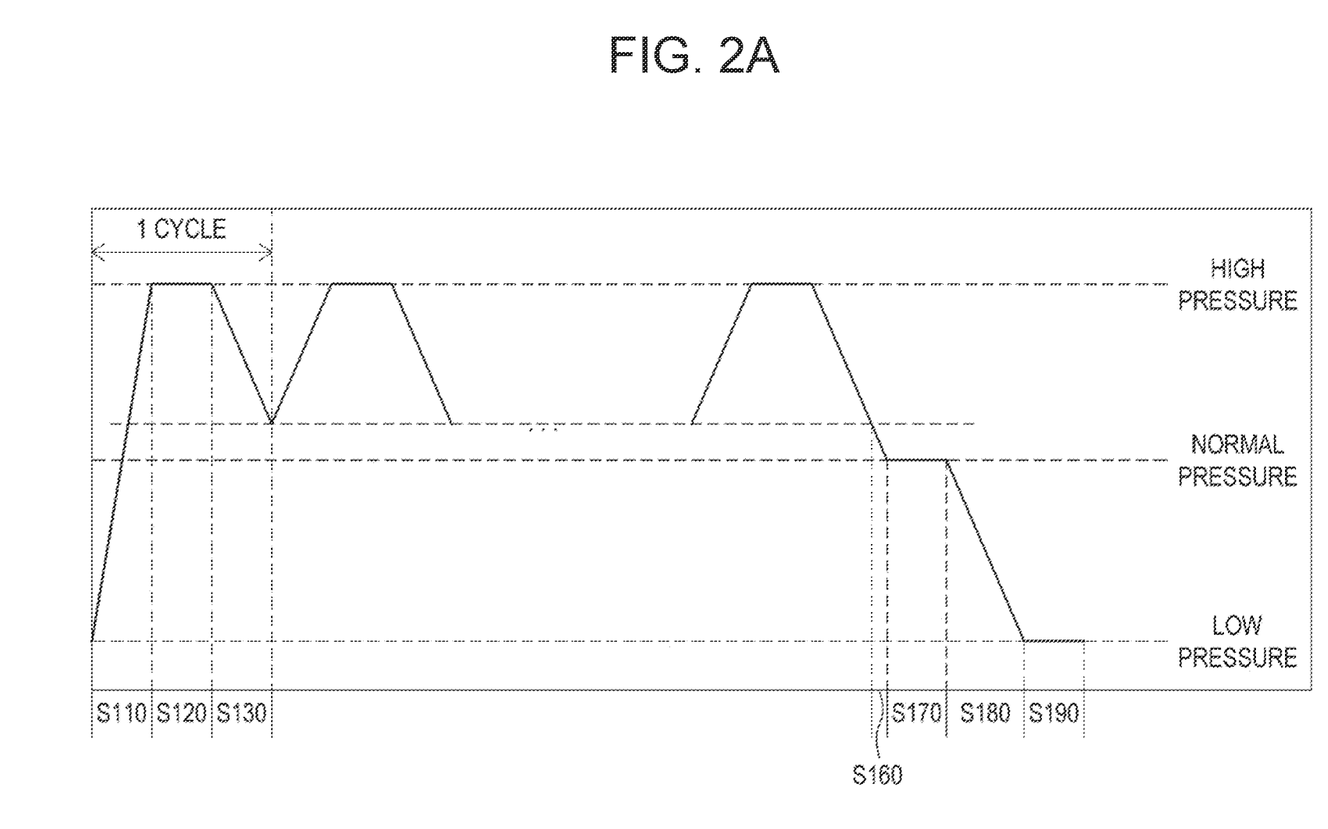
FIG. 2A is a drawing showing the pressure changes when the second high-pressure is higher than the normal pressure.
Figure 2B:
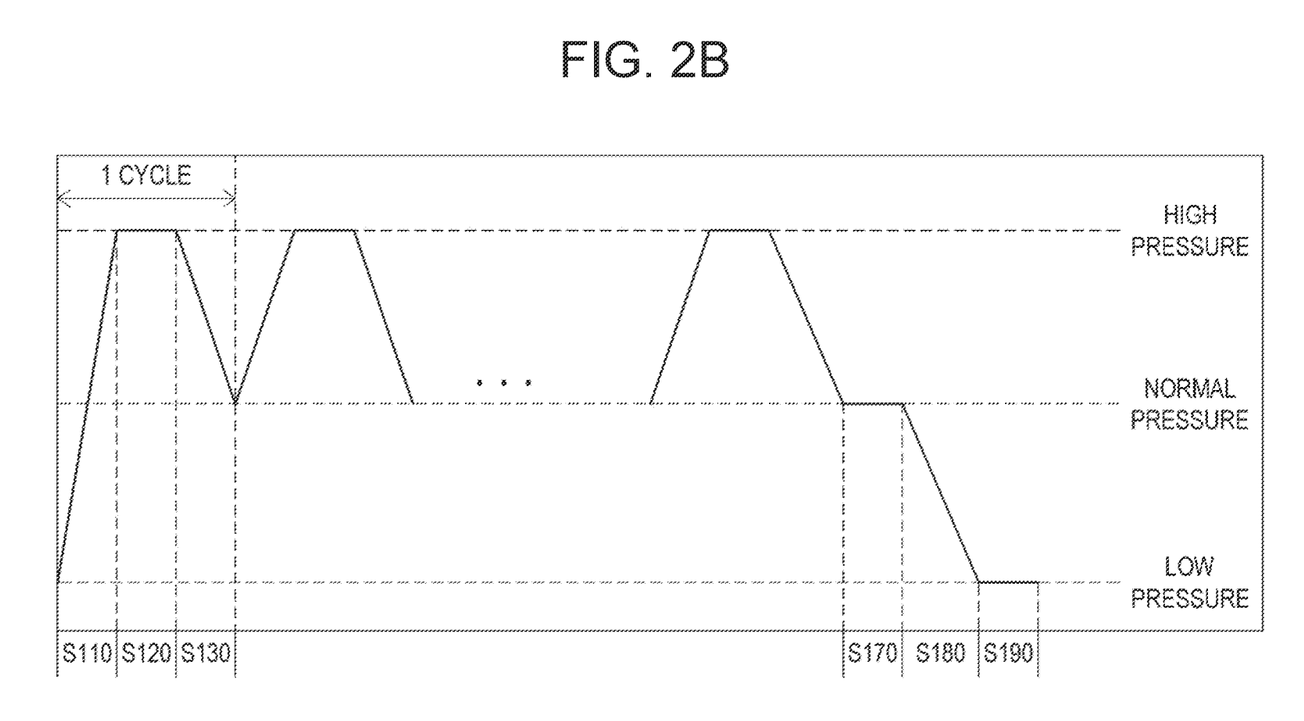
FIG. 2B is a drawing showing the pressure changes when the second high-pressure is the same as the normal pressure.

FIG. 1 is a flowchart illustrating the process of performing an embodiment of a substrate processing method according to the present disclosure. FIGS. 2A and 2B are drawings schematically showing the pressure changes inside a first chamber of an embodiment of a substrate processing method according to the present disclosure, FIG. 2A is a drawing showing the pressure changes when the second high-pressure is greater than the normal pressure, and FIG. 2B is a drawing showing the pressure changes when the second high-pressure is the same as the normal pressure.

Referring to FIGS. 1, 2A, and 2B, in an embodiment of a substrate processing method according to the present disclosure, a substrate is carried into a first chamber (S100). The substrate may be a substrate made of silicon, silicon oxide, silicon nitride, silicon carbide, graphite, graphene, a III-V compound, a II-VI compound, or the like, and is not particularly limited thereto. The first chamber may be a chamber capable of pressurizing/depressurizing, and provided with a gas supply means, a heating means, a pumping means, and a high-pressure valve, etc.

A thin film may be formed on the substrate, and the thin film formed on the substrate may be a thin film constituting at least a part of the gate insulating film of the transistor. The thin film formed on the substrate may contain at least one of the metal element, a Group IV element, a III-V compound, a II-VI compound, nitrogen (N), oxygen (O), and boron (B), for example, is a thin film made of silicon, silicon oxides, silicon nitrides, metal oxides, metal nitrides, a III-V compound, a II-VI compound, a ternary compound, or a quaternary compound. The method of forming the thin film is not particularly limited. The thin film can be formed by physical vapor deposition (PVD), chemical vapor deposition (CVD), atomic layer deposition (ALD), etc., and the process temperature or the process pressure is not particularly limited.

The thin film formed on the substrate may be a nitride thin film or a metal nitride thin film, more specifically, a titanium nitride (TiN) thin film. Chemical vapor deposition or atomic layer deposition may be used to form a metal nitride thin film. In this case, a metal precursor containing halogen may be used as the metal precursor, and a gas containing nitrogen may be used as the reaction gas. For example, a titanium nitride (TiN) thin film may be formed by using an atomic layer deposition method with a titanium tetrachloride ($TiCl_4$) precursor and nitrogen ($N_2$) or ammonia ($NH_3$) reaction gas.

Next, the pressure in the first chamber is increased so that the pressure in the first chamber reaches the first high-pressure (a first pressurizing step, S110). The first high-pressure may be a pressure of about 1 to 30 atm that is a pressure equal to or higher than the normal pressure. The first pressurizing step S110 may be performed with a first gas atmosphere or may be performed while inside the first chamber is heated. The first gas may contain at least one of hydrogen (H), oxygen (O), nitrogen (N), chlorine (Cl), and fluorine (F), and an optimal gas is selected according to the thin film form on the substrate. For example, a reducing gas may be used as the first gas, and a gas containing hydrogen (H) may be used. More specifically, hydrogen ($H_2$) gas may be used. Or, for the oxidation heat processing for oxidizing the thin film, oxygen ($O_2$) gas may be used as the first gas. An optimum temperature inside the first chamber may be selected according to the type of thin film formed on the substrate.

Next, the pressure inside the first chamber is maintained at the first high-pressure for a predetermined time (a first high-pressure maintaining step, S120). The first high-pressure maintaining step S120 may be performed with a first gas atmosphere, and the first gas may be the same gas as the gas used in step S110.

Next, the pressure in the first chamber is decreased to reach the second high-pressure (a first depressurizing step, S130). The second high-pressure is lower than the first high-pressure and equal to or higher than the normal pressure. The first depressurizing step S130 is a step in which the first high-pressure is decreased to the second high-pressure and may be performed only by the operation of a valve without pumping inside the first chamber.

Next, deciding whether the pressurizing/depressurizing process S110 to S130 is to be repeated (S140), and a cycle composed of steps S110 to S130 is repeatedly performed at a predetermined number of times.

Next, the pressure in the first chamber is decreased so that the pressure in the first chamber becomes the first low-pressure (second depressurizing step, S150).

In this case, when the second high-pressure is greater than the normal pressure, the second depressurizing step S150 is divided into a 2-1 depressurizing step lowering the pressure in the first chamber so that the pressure in the first chamber becomes the normal pressure (S160), a first normal pressure maintaining step maintaining the pressure inside the first chamber at the normal pressure for a predetermined time (S170), and a 2-2 depressurizing step lowering the pressure inside the first chamber so that the pressure in the first chamber becomes a first low-pressure (S180) (refer FIG. 2A). And, when the second high-pressure is the normal pressure, the second depressurizing step S150 is divided into a first normal pressure maintaining step S170 maintaining the pressure in the first chamber at the normal pressure for a predetermined time, and a 2-2 depressurizing step S180 lowering the pressure in the first chamber so that the pressure in the first chamber becomes the first low-pressure (refer FIG. 2B).

In the first normal pressure maintaining step S170, a purge gas may be supplied into the first chamber. As the purge gas, an inert gas, for example, nitrogen ($N_2$) gas may be used. When the purge gas is supplied to the first chamber in the first normal pressure maintaining step S170, the first gas supplied in the first pressurizing step S110 and the first high-pressure maintaining step S120 can be diluted, the safety of the entire process is enhanced by diluting the first gas, and the first gas can be more easily exhausted in the 2-2 depressurizing step (S180).

The first low-pressure may be a pressure of about 10 to 0.01 Torr that is lower than or equal to the normal pressure. The 2-1 depressurizing step S160 is a step lowering the pressure to the normal pressure and may be performed only by an operation of a valve without pumping inside the first chamber. The 2-2 depressurizing step S180 is a step lowering the normal pressure to the first low-pressure and may be performed by pumping inside the first chamber.

Next, the pressure in the first chamber is maintained at the first low-pressure for a predetermined time (the first low-pressure maintaining step, S190). The predetermined time for maintaining the pressure in the first chamber at the first low-pressure may be changed depending on the type of the thin film, the method of forming the thin film, etc., but the low-pressure is maintained for at least 1 minute.

In the conventional pressurizing/depressurizing process, since pressurizing to a high-pressure that is higher than the normal pressure and depressurizing to a low-pressure below the normal pressure is performed repeatedly, the processing time is long, and the heat budget increases accordingly. However, according to the pressurizing/depressurizing process of this embodiment of the present disclosure, since pressurizing to a first high-pressure that is higher than the normal pressure and depressurizing to the second high-pressure that is lower than the first high-pressure and higher than the normal pressure is performed repeatedly, the total process time is reduced, and the heat budget is reduced too. And the depressurizing processing can be performed without pumping.

Figure 3:
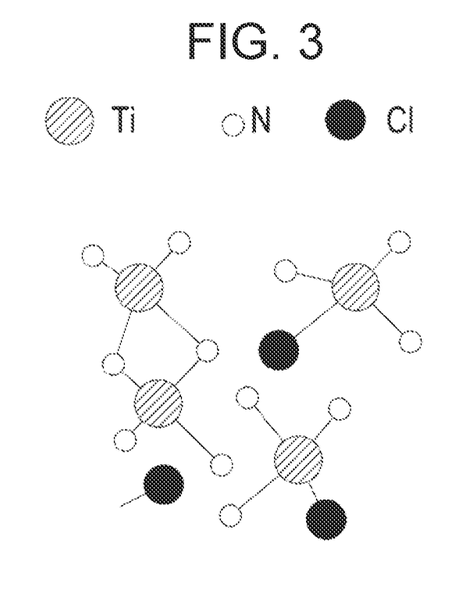
FIGS. 3 to 5 are schematic drawings to explain the state in the thin film when the pressurizing step and the depressurizing step are performed.
Figure 4:
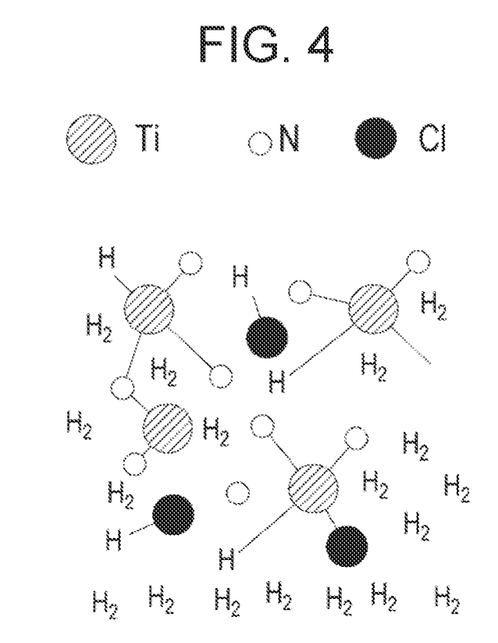
Figure 5:
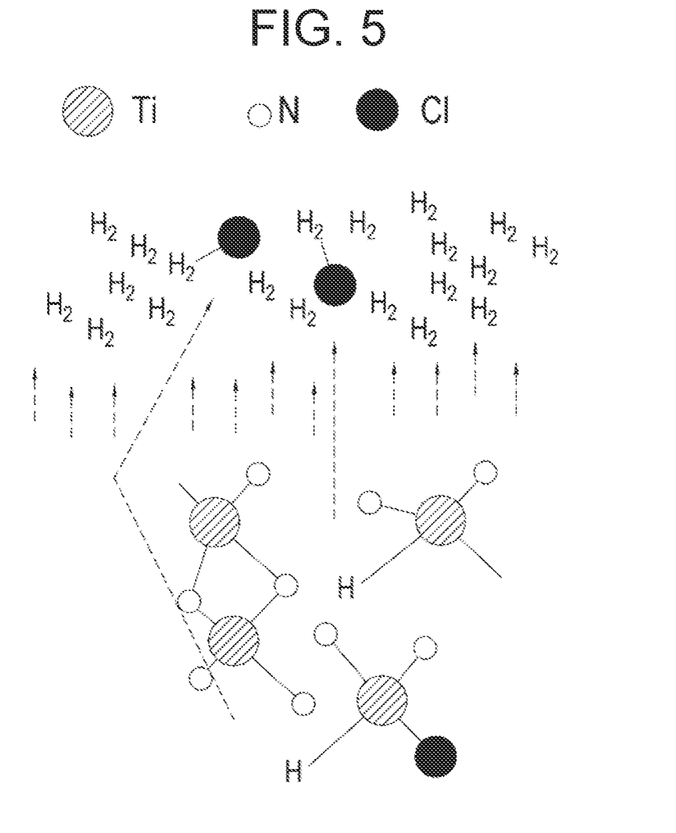

FIGS. 3 to 5 are schematic drawings to explain the state in the thin film when the pressurizing step and the depressurizing step are performed. FIGS. 3 to 5 show inside the first chamber and the state of the thin film when a titanium nitride (TiN) thin film is formed on a substrate by an atomic layer deposition method using a titanium tetrachloride (TiCl4) precursor and reaction gas of nitrogen (N2) or ammonia (NH3), the first pressurizing step S110 and the first high-pressure maintaining step S120 in a hydrogen (H2) atmosphere, then the first depressurizing step S130 is performed.

FIG. 3 is a diagram schematically illustrating a state in the thin film immediately after forming the titanium nitride (TiN) thin film on the substrate (as-dep.), in which chlorine (Cl), an impurity, is contained in the titanium nitride (TiN) thin film. Immediately after the formation of the titanium nitride (TiN) thin film, chlorine in a loose bonded state (Cl) with titanium (Ti), chlorine in a tightly bonded state (Cl) with titanium (Ti), and free unbound chlorine (Cl) could be contained in the thin film.

FIG. 4 is a diagram schematically illustrating a state in the thin film after performing the first pressurizing step S110 and the first high-pressure maintaining step S120 in a hydrogen (H2) atmosphere. When the first pressurizing step S110 in a hydrogen (H2) atmosphere is performed, chlorine (Cl) which was separated from the loose bonded state with titanium (Ti) and free unbound chlorines are bonded with hydrogen (H) and become hydrogen chloride (HCl) in an inactive state that is easily vaporized. And the possibility of breaking the tight bond between chlorine (Cl) and titanium (Ti) increases. Namely, hydrogen (H2) gas reacts with chlorine (Cl), which is an impurity, to form hydrogen chloride (HCl), which is a by-product.

FIG. 5 is a diagram schematically illustrating the process of performing the first pressure reduction step S130 after performing the first pressurizing step S110 and the first high-pressure maintaining step S120 in a hydrogen (H2) atmosphere. When the first depressurizing step S130 is performed, chlorine (Cl) impurities are discharged to the outside of the thin film in the form of hydrogen chloride (HCl) as the pressure is rapidly reduced under a pressurized state.

Steps S110 to S190 may be performed on a substrate on which a thin film is not formed. Namely, steps S120 to S190 can be performed in an appropriate gas atmosphere to treat the substrate before supplying the raw material gas for forming the thin film, thereby reducing the instability of the surface of the substrate, and improving the physical properties of the thin film during subsequent thin film formation.

Steps S110 to S190 may be performed on the substrate on which the thin film is formed to improve the physical properties of the formed thin film, and steps S110 to S190 may be performed in the middle of forming the thin film on the substrate. Namely, after forming a part of the thin film by supplying the raw material gas to the substrate, steps S110 to S190 are performed to improve the physical properties of the thin film while stopping the thin film formation, and again the process of forming the thin film by supplying the raw material gas is repeated to improve the physical properties of the thin film.

Figure 6:
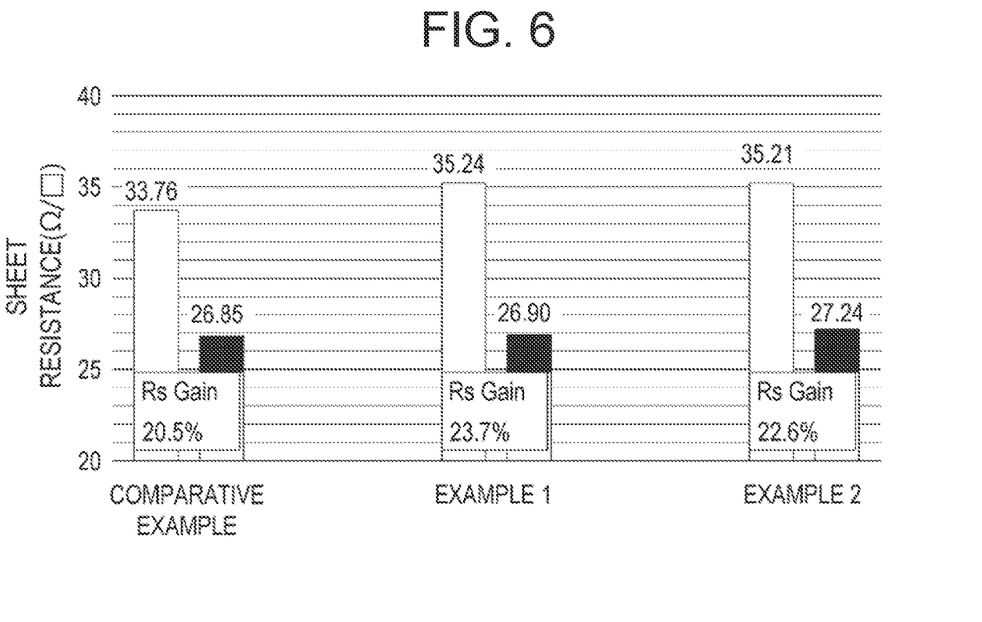
FIG. 6 is a drawing showing an effect of the improved electrical properties of the thin film according to the present disclosure and showing a change in sheet resistance before and after the heat treatment.

The changes in physical properties of the thin film are shown in FIG. 6 when the substrate processing method according to the present embodiment is performed. FIG. 6 is a view showing a change in sheet resistance between before and after the pressuring/depressurizing process after forming a titanium nitride (TiN) thin film on a substrate.

Figure 7:
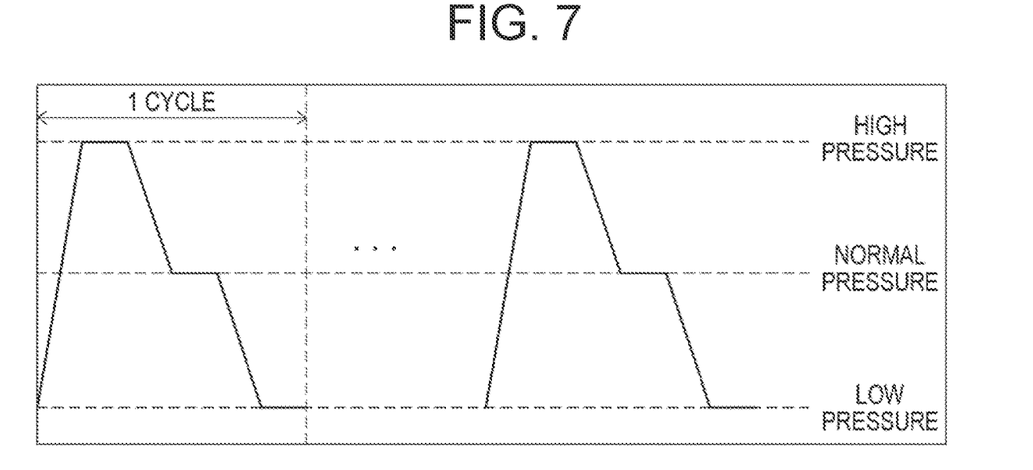
FIG. 7 is a schematic drawing showing pressure changes inside a first chamber according to a conventional thin film processing method.

In FIG. 6, one cycle (S110 to S130) of this Example 1 had been performed 5 times, and the hit budget was 30 minutes. One cycle (S110 to S130) of In Example 2 had been performed 3 times, and the hit budget was 20 minutes. In the case of Comparative Example 1, a conventional pressurizing/depressurizing process (pressurizing to a pressure above the normal pressure and then depressurizing to a pressure below the normal pressure) shows a pressure change as shown in FIG. 7, and one cycle shown in FIG. 7 had been performed 3 times, and the hit budget was 30 minutes.

As shown in FIG. 6, comparing the cases of performing the same three cycles (Example 2 and Comparative Example), the case of Example 2 showed excellent sheet resistance improvement effect (22.6% vs 20.5%), and the hit budget was found to be decreased by 10 minutes. Comparing the cases having the same hit budget (Example 1 and Comparative Example), it was found that the case of Example 1 greatly improved the sheet resistance improvement effect (23.7% vs 20.5%). Compared to the conventional pressurizing/depressurizing process, the pressurizing/depressurizing process according to the present embodiment exhibits excellent sheet resistance improvement effect and can shorten the heat budget.

Figure 8:
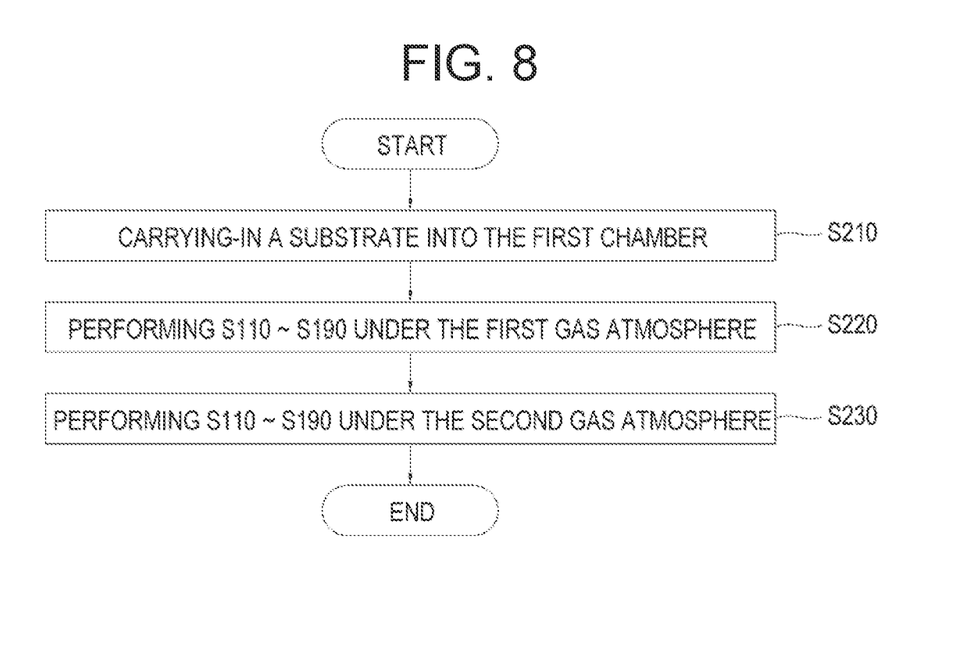
FIG. 8 is a flowchart illustrating a process of performing another embodiment of a substrate processing method according to the present disclosure.

FIG. 8 is a flowchart illustrating a process of performing another embodiment of a substrate processing method according to the present disclosure.

Referring to FIG. 8, in another embodiment of a substrate processing method according to the present disclosure, a substrate is carried into a first chamber (S210). A thin film may be formed on the substrate, and the thin film formed on the substrate may be a thin film constituting at least a part of the gate insulating film of the transistor. The thin film formed on the substrate may contain at least one of the metal element, a Group IV element, a III-V compound, a II-VI compound, nitrogen (N), oxygen (O), and boron (B), for example, is a thin film made of silicon, silicon oxides, silicon nitrides, metal oxides, a III-V compound, a II-VI compound, a ternary compound, and a quaternary compound. Since step S210 is the same as the step S100 illustrated and described in FIG. 1, a detailed description thereof will be omitted.

Next, steps S110 to S190 of FIG. 1 are performed in a first gas atmosphere (S220). Especially, steps S110 and S120 of FIG. 1 are performed in the first gas atmosphere. Step S220 is the same as that illustrated and described in FIG. 1, so a detailed description thereof will be omitted. [0039] Steps S110 to S190 of FIG. 1 are performed in a second gas atmosphere that is different from the first gas (S230). Especially, steps S110 and S120 of FIG. 1 are performed in a second gas atmosphere. The second gas may be a gas containing at least one of hydrogen (H), oxygen (O), nitrogen (N), chlorine (Cl), and fluorine (F). For example, a gas containing nitrogen (N) may be supplied for nitridation, and ammonia, methylamine, dimethylamine, or the like may be used as the gas containing nitrogen (N).

In the case of step S230, to distinguish it from step S220, step S110 of step S230 may be expressed as the second pressurizing step for increasing the pressure in the first chamber to reach a third high-pressure, step S120 of step S230 may be expressed as a second high-pressure maintaining step maintaining the third high-pressure for a predetermined time, step S130 of step S230 may be expressed as a third depressurizing step decreasing the pressure inside the first chamber in which the pressure is lower than the third high-pressure and higher than the normal pressure, step S160 of step S230 may be expressed as a 4-1 depressurizing step lowering the pressure so that the pressure in the first chamber becomes the normal pressure, step S170 of step S230 may be expressed as a second normal pressure maintaining step maintaining the normal pressure for a predetermined time, step S180 of step S230 may be expressed as a 4-2 depressurizing step for decreasing the pressure in the first chamber so that the pressure in the first chamber becomes the second low-pressure, step S150 of step S230 may be expressed as a fourth depressurizing step for decreasing the pressure in the first chamber to become a second low-pressure which is lower than the normal pressure, and step S190 of step S230 may be expressed as a second low-pressure maintaining step for maintaining the low-pressure for a predetermined time. As described above, the expressions may be different to distinguish step S230 from step S220, but the processes of changing and maintaining the pressure in the first chamber are the same as those illustrated and described in FIG. 1.

The first high-pressure and the third high-pressure may be the same or different, and the time for maintaining the first high-pressure and the second high-pressure may be the same or different. The second high-pressure and the fourth high-pressure may be the same or different. The time for maintaining the normal pressure in steps S220 and S230 may be the same or different. In addition, the first low-pressure and the second low-pressure may be the same or different, and the time for maintaining the first low-pressure and the second low-pressure may be the same or different. In the case of maintaining the atmospheric pressure for a predetermined time in step S230, a purge gas may be supplied into the first chamber, and nitrogen (N2) gas, an inert gas, may be used as the purge gas. When the purge gas is supplied when the normal pressure is maintained for a predetermined time, as described above, the second gas supplied in the pressurizing step can be diluted and exhausted.

The first gas and the second gas may be optimally selected depending on the thin film formed on the substrate. For example, the thin film formed on the substrate may be a nitride thin film or a metal nitride thin film. More specifically, it may be a titanium nitride (TiN) thin film. Chemical vapor deposition or atomic layer deposition may be used to form a metal nitride thin film, in which a metal precursor containing halogen may be used as the metal precursor, and a gas containing nitrogen may be used as the reaction gas. More specifically, a titanium nitride (TiN) thin film may be formed by the atomic layer deposition method using a titanium tetrachloride (TiCl4) precursor and nitrogen (N2) or ammonia (NH3) reaction gas.

When the nitride thin film is formed on the substrate as described above, a reducing gas may be used as the first gas, and hydrogen (H) containing gas may be used. More specifically, hydrogen (H2) gas may be used. As the second gas, nitrogen (N) containing gas may be used, and more specifically, ammonia (NH3) gas may be used. In this case, the number of times the steps S110 to S130 are repeated in step S220 is more than the number of times steps S110 to S130 are repeated in step S230.

Figure 9:
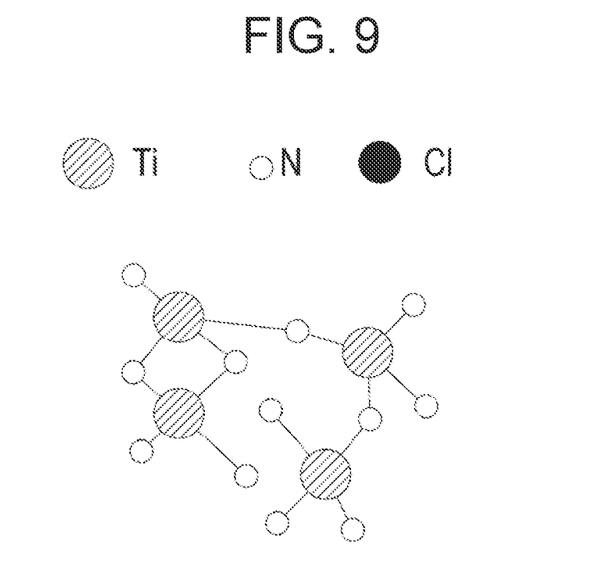
FIG. 9 is a schematic drawing to explain the state in the thin film where the pressurizing and the depressurizing step are performed in a first gas atmosphere, then the pressurizing and the depressurizing step are performed in a second gas atmosphere.

FIG. 9 is a schematic diagram for explaining a case where the pressurizing step and the depressurizing step are performed in the first gas atmosphere, and then the pressurizing step and the depressurizing step are performed in the second gas atmosphere. FIG. 9 shows the state in a thin film when a titanium nitride (TiN) thin film is formed on a substrate by atomic layer deposition using a titanium tetrachloride (TiCl4) precursor and nitrogen (N2) or ammonia (NH3) reaction gas, the pressurizing step and the depressurizing step are performed in a hydrogen (H2) atmosphere, and then the pressuring step and the depressurizing step are performed in ammonia (NH3) gas atmosphere.

Referring to FIG. 9, if the pressurizing step and the depressurizing step are performed in ammonia (NH3) gas atmosphere after performing the pressurizing step and the depressurizing step in a hydrogen (H2) gas atmosphere on a titanium nitride (TiN) thin film, nitrogen (N) is bonded to where chlorine (Cl) impurities are removed, and the overall bonding state is also made more rigid. Accordingly, a titanium nitride (TiN) thin film having high titanium (Ti) content is formed immediately after the formation of the titanium nitride (TiN) thin film (as-dep.). However, when steps S220 and S230 are performed, the impurities are removed, and the composition ratio of (Ti) and nitrogen (N) in the titanium nitride (TiN) thin film is changed to almost 1:1.

Immediately after the formation of a titanium nitride (TiN) thin film (as-dep.), the titanium nitride (TiN) thin film has high titanium (Ti) content and much chlorine (Cl) impurities. However, if step S220 is performed in hydrogen (H2) atmosphere, hydrogen chloride (HCl) which is easily vaporized is formed by breaking the bonding of titanium (Ti) and chlorine (Cl) impurities through the pressurizing step, and then the hydrogen chloride (HCl) experiences out-diffusion through the depressurizing step thereby impurities are reduced, and electrical properties are improved. At this time, when the reduced low-pressure is maintained for a certain period during the depressurizing step as in the present embodiment, the effect of removing chlorine (Cl) impurities increases.

When step S230 is performed in ammonia (NH3) atmosphere, nitrogen (N) is bonded to the place where chlorine (Cl) impurities are removed through the pressurizing step, thereby increasing the bonding of titanium (Ti) and nitrogen (N), and the remaining impurities are further reduced by the depressurizing step with improved oxidation resistant. According to this embodiment, since the removal effect of chlorine (Cl) impurities increases as the low-pressure is maintained for a certain time in step S220 in the hydrogen (H2) atmosphere, the bonding of titanium (Ti) with nitrogen (N) increases through step S230 in ammonia (NH3) atmosphere, the composition ratio of titanium (Ti) and nitrogen (N) in the titanium nitride (TiN) thin film is closer to 1:1, therefore, oxidation resistant is further improved.

Compared to the case of the conventional plasma nitridation process, in which nitriding is not well performed on the sidewall or bottom part in a 3-D semiconductor device or a semiconductor device having a high aspect ratio, according to the present embodiment, it is possible to uniformly treat the substrate, and since plasma is not used, there will be no fear of damage by plasma.

In FIG. 8, a method of performing the pressurizing/depressurizing process in different gas atmospheres using one chamber has been illustrated and described. However, such a substrate processing method may be performed using a batch-type substrate processing apparatus capable of simultaneously performing a substrate treating process on a plurality of substrates. Likewise, it is also possible to perform pressurizing/depressurizing process in different gas atmospheres using one chamber in other substrate processing apparatuses. The present disclosure includes a case in which the pressurizing/depressurizing process is performed in different gas atmospheres using different chambers.

Figure 10:
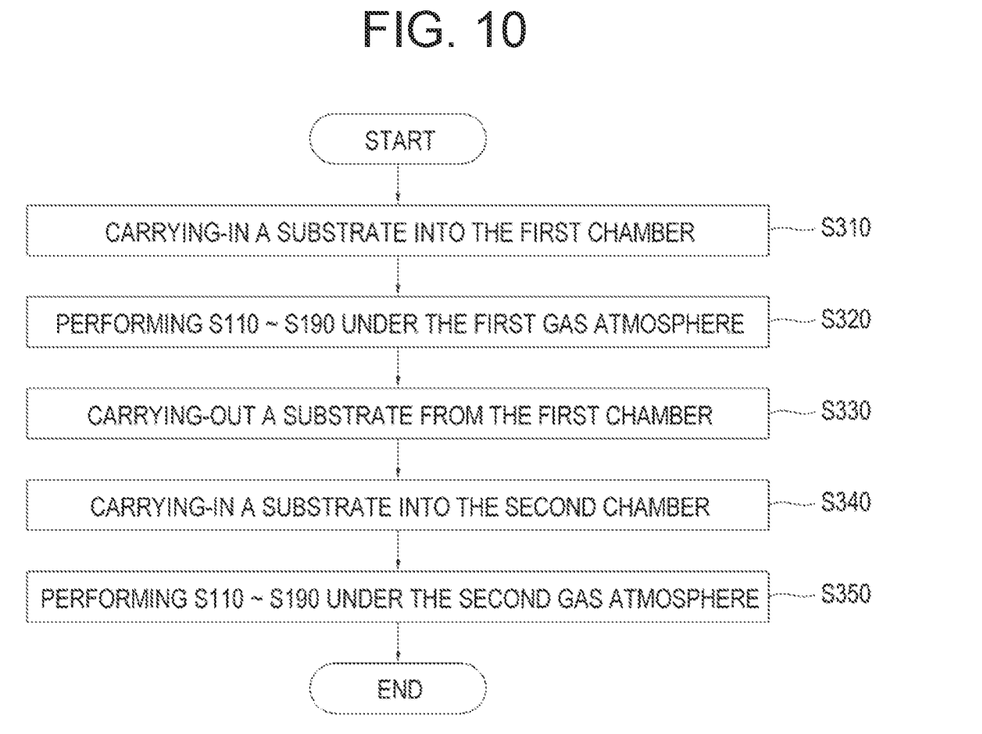
FIG. 10 is a flowchart illustrating a process of performing another embodiment of a substrate processing method according to the present disclosure.

FIG. 10 is a flowchart showing a process of performing another embodiment of the substrate processing method according to the present disclosure, in which a pressurizing/depressurizing process is performed in a first gas atmosphere of a first chamber, and a pressurizing/depressurizing process is performed in a second gas atmosphere of a second chamber. Therefore, according to this embodiment, the pressurizing/depressurizing process may be performed by a substrate processing apparatus having a plurality of chambers, or by different substrate processing apparatuses. For example, it may be performed using a cluster type substrate processing apparatus having a plurality of chambers.

Referring to FIG. 10, in another embodiment of a substrate processing method according to the present disclosure, a substrate is loaded into a first chamber (S310). The first chamber may be a process chamber of a cluster type single wafer processing apparatus. A thin film may be formed on the substrate, and the thin film formed on the substrate may be a thin film forming at least a part of the gate insulating film of the transistor. In addition, the thin film formed on the substrate may contain at least one of the metal element, a Group IV element, a III-V compound, a II-VI compound, nitrogen (N), oxygen (O), and boron (B), for example, it may be a thin film made of silicon, silicon oxide, silicon nitride, metal oxide, metal oxide, III-V compound, II-VI compound, ternary compound, and quaternary compound. Since step S310 is similar to step S100 which was illustrated and described in accordance with FIG. 1, thus detailed description thereof will be omitted.

Next, steps S110 to S190 of FIG. 1 are performed in the first chamber (S320). Since step S320 is the same as step S220, a detailed description will be omitted.

Next, the substrate is carried out from the first chamber (S330). Then, the substrate is carried into the second chamber (S340). When the substrate processing apparatus used in this embodiment is a plurality of substrate processing apparatuses having one chamber, after performing step S320 in one substrate processing apparatus, the substrate is carried out from the chamber of the substrate processing apparatus (S330) and is carried into a chamber of another substrate processing apparatus (S340). On the other hand, when the substrate processing apparatus used in the present embodiment is a cluster type single wafer substrate processing apparatus having a plurality of chambers, after performing step S320 in the first chamber, the substrate is carried out from the first chamber using the substrate transfer module (S330) and carried into the second chamber (S340).

In the second chamber, steps S110 to S190 of FIG. 1 are performed in a second gas atmosphere which is different from the first gas atmosphere (S350). Since step S350 is the same as step S230, except that it is performed in the second chamber instead of the first chamber, a detailed description will be omitted.

The first gas and the second gas may be optimally selected according to the thin film formed on the substrate. For example, the thin film formed on the substrate may be a nitride thin film or a metal nitride thin film. More specifically, it may be a titanium nitride (TiN) thin film. Chemical vapor deposition or atomic layer deposition may be used to form a metal nitride thin film. In this case, a metal precursor containing halogen may be used as the metal precursor, and a gas containing nitrogen may be used as the reaction gas. More specifically, a titanium nitride (TiN) thin film may be formed by atomic layer deposition using a titanium tetrachloride (TiCl4) precursor and nitrogen (N2) or ammonia (NH3) reaction gas.

When a nitride thin film is formed on the substrate as described above, a reducing gas may be used as the first gas used in the first chamber, and hydrogen (H) containing gas may be used either. More specifically, hydrogen (H2) gas may be used. As the second gas used in the second chamber, nitrogen (N)-containing gas may be used, and more specifically, ammonia (NH3) gas may be used. In this case, the number of repeating steps S110 to S130 in step S320 is more than the number of repeating steps S110 to S130 in step S350.

As described above, according to the present disclosure, it is possible to perform the pressurizing/depressurizing process with different gas atmospheres in different chambers, and even in this case, as described above, impurities can be effectively removed, thereby improving electrical characteristics. By performing the pressurizing/depressurizing process in an atmosphere of hydrogen (H2) gas and ammonia (NH3) gas, the nitrogen (N) content in the thin film is increased, and oxidation-resistant can be improved.

Although the embodiments of the present disclosure have been illustrated and described above, the present disclosure is not limited to the specific embodiments described above and is not departing from the gist of the present disclosure claimed in the claims. A person having ordinary skill in the art may implement various modifications, and such modifications are included within the scope of the appended claims.

What is claimed is:

1. A substrate processing method comprising the steps of:
carrying a substrate into a first chamber;
a first pressurizing step increasing the pressure in the first chamber so that the pressure in the first chamber reaches a first high-pressure that is higher than the normal pressure;
a first depressurizing step decreasing the pressure in the first chamber so that the pressure in the first chamber reaches a second high-pressure that is lower than the first high-pressure and equal to or higher than the normal pressure;
a first pressurizing/depressurizing repeating step performing the first pressurizing step and the first depressurizing step repeatedly a predetermined number of times; and
a second depressurizing step decreasing the pressure in the first chamber so that the pressure in the first chamber reaches a first low-pressure that is lower than the normal pressure,
wherein the first pressurizing step is performed in a first gas atmosphere, wherein, after the second depressurizing step, the method further comprises:

carrying out the substrate from the first chamber;

carrying in the substrate into a second chamber;

a second pressurizing step increasing the pressure in the second chamber to reach a third high-pressure that is higher than the normal pressure in a second gas atmosphere that is different from the first gas atmosphere;

a third depressurizing step decreasing the pressure in the second chamber to reach a fourth high-pressure that is lower than the third high-pressure and higher than the normal pressure;

a second pressurizing/depressurizing repeating step performing the second pressurizing step and the third depressurizing step repeatedly a predetermined number of times; and a fourth depressurizing step decreasing the pressure in the second chamber to reach a second low-pressure that is lower than the normal pressure.

2. The substrate processing method according to claim 1, wherein if the second high-pressure is greater than the normal pressure, the second depressurizing step comprises:

a 2-1 depressurizing step lowering the pressure in the first chamber so that the pressure in the first chamber becomes the normal pressure; and a 2-2 depressurizing step lowering the pressure in the first chamber so that the pressure in the first chamber becomes said first low-pressure, or wherein if the second high-pressure is the normal pressure, the second depressurizing step comprises:

said 2-2 depressurizing step lowering the pressure in the first chamber so that the pressure in the first chamber becomes said first low-pressure.

3. The substrate processing method according to claim 2, wherein if the second high-pressure is greater than the normal pressure, before the 2-2 depressurizing step, the second depressurizing step further comprises:

a first normal pressure maintaining step maintaining the normal pressure for a predetermined time.

4. The substrate processing method according to claim 3, wherein said first normal pressure maintaining step further comprises providing purge gas.

5. The substrate processing method according to claim 1, wherein, after the second depressurizing step, the method further comprises:

a first low-pressure maintaining step maintaining the first low-pressure for a predetermined time.

6. The substrate processing method according to claim 1, wherein, between the first pressurizing step and the first depressurizing step, the method further comprises:

a first high-pressure maintaining step maintaining said first high-pressure for a predetermined time, and wherein the pressurizing/depressurizing repeating step performing repeatedly the first pressurizing step, the first high-pressure maintaining step, and the first depressurizing step in this order.

7. The substrate processing method according to claim 1, wherein, after the fourth depressurizing step, the method further comprises:

a second low-pressure maintaining step maintaining the second low-pressure for a predetermined time.

8. The substrate processing method according to claim 1, wherein, if the fourth high-pressure is greater than the normal pressure, the fourth depressurizing step comprises:

a 4-1 depressurizing step lowering the pressure in the second chamber so that the pressure in the second chamber becomes the normal pressure; and a 4-2 depressurizing step lowering the pressure in the second chamber so that the pressure in the second chamber becomes said second low-pressure, or wherein if the fourth high-pressure is the normal pressure, the fourth depressurizing step comprises:

said 4-2 depressurizing step lowering the pressure in the second chamber so that the pressure in the second chamber becomes said second low-pressure.

9. The substrate processing method according to claim 8, wherein, before the 4-2 depressurizing step, the fourth depressurizing step further comprises:

a second normal pressure maintaining step maintaining the normal pressure for a predetermined time.

10. The substrate processing method according to claim 9, wherein said second normal pressure maintaining step further comprises providing purge gas.

11. The substrate processing method according to claim 1, wherein, between the second pressurizing step and the third depressurizing step, the method further comprises:

a second high-pressure maintaining step for maintaining said third high-pressure for a predetermined time, and wherein the second pressurizing/depressurizing repeating step performs the second pressurizing step, the second high-pressure maintaining step, and the third depressurizing step repeatedly in this order a predetermined number of times.

12. The substrate processing method according to claim 1, wherein the first gas contains at least one of hydrogen (H), oxygen (O), nitrogen (N), chlorine (Cl), and fluorine (F).

13. The substrate processing method according to claim 1, wherein the second gas contains at least one of hydrogen (H), oxygen (O), nitrogen (N), chlorine (Cl), and fluorine (F).

14. The substrate processing method according to claim 1, wherein a thin film is formed on the substrate.

15. The substrate processing method according to claim 14, wherein the thin film constitutes at least a part of a gate insulating film of the transistor.

16. The substrate processing method according to claim 14, wherein the thin film contains at least one of the metal element, a Group IV element, a III-V compound, a II-VI compound, nitrogen (N), oxygen (O), and boron (B).

* * * * *